United States Patent
Bernhardt et al.

(10) Patent No.: US 7,547,646 B2
(45) Date of Patent: Jun. 16, 2009

(54) TRENCH CAPACITOR STRUCTURE AND PROCESS FOR APPLYING A COVERING LAYER AND A MASK FOR TRENCH ETCHING PROCESSES IN SEMICONDUCTOR SUBSTRATES

(75) Inventors: Henry Bernhardt, Dresden (DE); Michael Stadtmüller, Dresden (DE); Olaf Storbeck, Dresden (DE); Stefan Kainz, Dresden (DE)

(73) Assignee: Infineon Technologies AG, Neubiberg (DE)

(*) Notice: Subject to any disclaimer, the term of this patent is extended or adjusted under 35 U.S.C. 154(b) by 535 days.

(21) Appl. No.: 10/974,797

(22) Filed: Oct. 28, 2004

(65) Prior Publication Data

US 2005/0118777 A1    Jun. 2, 2005

(30) Foreign Application Priority Data

Aug. 31, 2003   (DE) ............................... 103 51 031
May 14, 2004   (DE) ....................... 10 2004 024 105

(51) Int. Cl.
   *H01L 21/31*   (2006.01)
   *H01L 21/469*   (2006.01)
(52) U.S. Cl. ...................... 438/775; 438/791
(58) Field of Classification Search ............ 438/775, 438/791
   See application file for complete search history.

(56) References Cited

U.S. PATENT DOCUMENTS

| | | | |
|---|---|---|---|
| 5,447,884 A | 9/1995 | Fahey et al. | |
| 5,711,891 A * | 1/1998 | Pearce ......................... | 216/51 |
| 6,165,916 A * | 12/2000 | Muraoka et al. ............ | 438/791 |
| 6,461,937 B1 | 10/2002 | Kim et al. | |
| 2001/0024867 A1 * | 9/2001 | Saida et al. .................. | 438/490 |
| 2002/0081864 A1 | 6/2002 | Zheng et al. | |
| 2003/0203587 A1 | 10/2003 | Gluschenkov et al. | |
| 2005/0118775 A1 * | 6/2005 | Goldbach et al. ............ | 438/386 |
| 2006/0105582 A1 * | 5/2006 | Aoki et al. ................... | 438/786 |

* cited by examiner

Primary Examiner—Zandra V. Smith
Assistant Examiner—Pamela E Perkins
(74) Attorney, Agent, or Firm—Edell, Shapiro & Finnan, LLC

(57) ABSTRACT

A stress relief layer between a single-crystal semiconductor substrate and a deposited silicon nitride layer or pad nitride is formed from thermally produced silicon nitride. The stress relief layer made from thermally produced silicon nitride replaces a silicon dioxide layer or pad oxide which is customary at this location for example in connection with mask layers. After patterning of a mask, which includes a protective layer portion formed from deposited silicon nitride, the material which is provided according to the invention for the stress relief layer reduces the restrictions imposed for subsequent process steps, such as for example wet-etching steps, acting both on the semiconductor substrate or structures in the semiconductor substrate and also on the stress relief layer. The thermal nitriding is advantageously incorporated into a preanneal step for expelling oxygen from the semiconductor substrate, so that the semiconductor substrate is protected from the etching action of the expelled oxygen by the stress relief layer which is formed, there is no need for an additional temporary etching protection layer for the semiconductor substrate and the overall processing is streamlined.

20 Claims, 4 Drawing Sheets

TRENCH CAPACITOR STRUCTURE AND PROCESS FOR APPLYING A COVERING LAYER AND A MASK FOR TRENCH ETCHING PROCESSES IN SEMICONDUCTOR SUBSTRATES

CROSS REFERENCE TO RELATED APPLICATIONS

This application claims priority under 35 USC §119 to German Application No. DE 103 51 031.1, filed on Oct. 31, 2003, and to German Application No. DE 10 2004 024 105.8, filed on May 14, 2004. The entire contents of these two patent applications are hereby incorporated by reference.

FIELD OF THE INVENTION

The invention relates to a process for applying a covering layer to a semiconductor substrate, in which the semiconductor substrate, which is formed from a semiconductor material, is provided, a stress relief layer is provided on a process surface of the semiconductor substrate, and the covering layer made from a material with an expansion coefficient that differs significantly from an expansion coefficient of the semiconductor material is applied to the stress relief layer. The invention also relates to a process for applying a mask for trench etching processes in semiconductor substrates and to a process for introducing trench structures into semiconductor substrates. The invention in each case also encompasses a trench capacitor structure, a mask arrangement and a layer arrangement produced using the process.

BACKGROUND

During a process for the fabrication of an integrated semiconductor circuit, a plurality of layers of different materials are applied to a semiconductor substrate, for example a silicon wafer. The applied layers are generally patterned. The patterned layers either remain in place and serve as electrically conducting layers, insulation layers or passivation layers in the finished semiconductor circuit, or are temporary in form and are used as a mask or starting layer for doping processes as part of the fabrication process.

On account of a layer material which forms one layer and the material of a layer beneath it or the semiconductor material of the semiconductor substrate having different coefficients of thermal expansion, stress relief layers, which reduce and/or compensate for mechanical stresses resulting from the different coefficients of thermal expansion and/or convert such stresses into a compressive pressure on the layer below, thereby preventing the layer on top from flaking off, are to be provided between the layer below and the layer on top for some combinations of layers.

It is therefore known for example to provide a silicon dioxide layer with a layer thickness of a few nanometers as stress relief layer between a monocrystalline silicon substrate and a relatively thick silicon nitride layer, with a layer thickness of more than 50 nanometers, above the monocrystalline silicon substrate. Silicon nitride layers are preferred for use as mask material or part of a mask on account of their good barrier properties with respect to diffusion phenomena of all types and on account of the fact that this material has a relatively high resistance to a range of etching processes that act on silicon.

One typical example relates to a mask for forming trenches in order to produce storage capacitors for memory cells of dynamic random access memories (DRAMs) in a semiconductor substrate. In this context, a silicon nitride layer (pad nitride), beneath which there is a stress relief layer (pad oxide) of silicon dioxide, protects covered portions of a semiconductor substrate both from the etching process for forming the trenches and from a subsequent extensive processing affecting the trenches in order to form the storage capacitors.

The etching processes which are of relevance to the invention as part of the formation of a trench in a semiconductor substrate are illustrated with reference to FIG. 1.

FIG. 1A shows a mask 3 and a stress relief layer 2 formed from silicon dioxide beneath the mask 3, through which a trench 4 has been introduced into a semiconductor substrate 1 by means of a trench etch. An original hard-mask portion 3*a* of the mask 3 made from borosilicate glass has been consumed apart from a hard mask residue 3*a'*. During the trench etch, a silicon oxide coating 3*c* was deposited on the vertical wall of the trench 4, assisting targeted etching of the semiconductor material into the depth of the semiconductor substrate 1.

After the trench etch has ended, the silicon oxide coating 3*c* which has been deposited at the trench wall is removed selectively with respect to the silicon of the semiconductor substrate 1 by means of a cleaning etch step. In the region of the semiconductor substrate 1, the cleaning etch step stops at the silicon of the semiconductor substrate 1. Since the cleaning etch step is controlled for a sufficiently long time to ensure reliable removal of the silicon oxide coating 3*c*, the cleaning etch step, after the silicon oxide coating 3*c* has been removed, also acts, in the region of the edge which is then uncovered, on the stress relief layer 2, which is likewise formed from silicon dioxide, and causes the stress relief layer 2 to recede. The hard-mask residues 3*a'* are then to be removed by a receding etch step. A material containing silicon oxide, such as borosilicate glass, is used for the hard-mask portion 3*a*, so that the receding etch step also acts on the silicon dioxide of the stress relief layer 2 and the stress relief layer 2 is caused to recede further.

Following the cleaning etch step and the receding etch step, the result, in simplified form, is the structure illustrated in FIG. 1B. The silicon oxide coating 3*c* and the hard-mask residues 3*a'* have been completely removed. Undercuts 5 have been formed in the stress relief layer 2 proceeding from the trench structure 4 beneath the silicon nitride layer 3*b* above it. During the further processing, the trench structure 4 is filled, for example with a conductive material, to form an inner electrode of a storage capacitor. The conductive material fills both the trench structure 4 and the undercuts 5, with the result that disruptive conductive structures are formed on the process surface 10 outside the trench structures 4. To restrict the extent of the undercuts 5, the process time for the cleaning etch step has hitherto been kept short and a hard-mask material which is relatively easy to remove has been used, so that the process time for the receding etch step can also be kept short.

U.S. Pat. Nos. 6,461,937 and 5,447,884 have disclosed a silicon nitride layer as stress relief layer between a layer of thermally grown silicon oxide, on the one hand, and silicate glass applied by means of a vapor deposition process (CVD, chemical vapor deposition), on the other hand, during the production of a trench isolation region. In this case, an isolation trench is introduced into a semiconductor substrate through a silicon nitride mask with a stress relief layer of silicon oxide beneath it. The isolation trench is lined by thermally grown silicon dioxide and is then filled with undoped silicate glass deposited by CVD. Since the semiconductor substrate has a coefficient of thermal expansion which differs significantly from that of the undoped silicate glass, considerable mechanical stresses are produced in the region of the isolation trench during further processing.

Therefore, a thin silicon nitride layer is provided as stress relief layer which is applied before the undoped silicate glass is deposited on the thermally grown oxide.

Another drawback of masks with a silicon nitride layer and a stress relief layer of silicon dioxide beneath them is that the mask and the stress relief layer have to be removed in two steps involving a change in the etching process. The stress relief layer is used as the etching stop layer or etching stop signal layer for removal of the silicon nitride layer above it.

SUMMARY OF THE INVENTION

An object of the present invention is to provide a process for applying a relatively thick silicon nitride layer to a semiconductor substrate in which a processing operation acting on a patterned covering layer is subject to the minimum possible restrictions.

Another object of the present invention is to provide a process for applying a mask, a process for introducing a trench structure into a semiconductor substrate and a layer arrangement, a mask arrangement and a trench capacitor structure which are in each case produced by the process according to the invention.

The aforesaid objects are achieved individually and/or in combination, and it is not intended that the present invention be construed as requiring two or more of the objects to be combined unless expressly required by the claims attached hereto.

According to the present invention, a process for applying a covering layer to a semiconductor substrate includes providing a semiconductor substrate that is formed from a semiconductor material, providing a stress relief layer on a process surface of the semiconductor substrate, and applying a covering layer to the stress relief layer, where the covering layer is made from a covering material with an expansion coefficient that is significantly different from that of the semiconductor material is applied to the stress relief layer, and the stress relief layer is produced by thermal nitriding of the semiconductor material.

In another embodiment of the present invention, a process for applying a mask for trench etching processes in semiconductor substrates includes providing a semiconductor substrate comprising a semiconductor material, providing a stress relief layer on a process surface of the semiconductor substrate, and applying at least one protective layer portion of the mask to the stress relief layer, where the at least one protective layer portion of the mask is made from a material with an expansion coefficient that is significantly different from that of the semiconductor material.

In a further embodiment of the present invention, a process for introducing a trench structure into a semiconductor substrate includes providing a semiconductor substrate comprising a monocrystalline semiconductor material, providing a stress relief layer on a process surface of the semiconductor substrate, where the stress relief layer is produced by thermal nitriding of the semiconductor material, providing a protective layer portion of a mask on the stress relief layer, and applying a hard-mask portion of the mask to the protective layer portion, where the hard-mask portion of the mask is produced by a thermal nitriding process. The mask is patterned using a photolithographic process, where the pattern of the mask is imaged into the semiconductor substrate so as to form the trench structure in the semiconductor substrate. The hard-mask portion is removed by a wet-etching process that prevents an undercut from forming within the protective layer portion.

In yet another embodiment of the present invention, a layer arrangement comprises a semiconductor substrate formed from a monocrystalline semiconductor material, a covering layer with a layer thickness of at least 50 nanometers arranged in portions over a process surface of the semiconductor substrate, the covering layer comprising a covering material with a coefficient of thermal expansion that is significantly different from that of the semiconductor material, and a stress relief layer provided between the semiconductor substrate and the covering layer. The stress relief layer is suitable for preventing the covering layer from flaking off in the event of high thermal loading, comprises a thermally produced semiconductor nitride and has a layer thickness of no greater than 2.5 nanometers.

In a still further embodiment of the present invention, a mask arrangement for trench etching of trench structures into a substrate comprising a monocrystalline semiconductor substrate includes a protective layer portion that is provided over a process surface of the semiconductor substrate and is resistant to a trench etch, where the protective layer includes a material having a coefficient of thermal expansion that is significantly different from that of the substrate material. A hard-mask portion is provided on the protective layer portion and is at least partially consumed during the trench etch. A protective layer portion that is resistant to trench etch is provided over a process surface of the semiconductor substrate, and a hard-mask portion is provided on the protective layer portion that is at least partially consumed during a trench etch process. The protective layer portion has a layer thickness of at least 50 nanometers and comprises a material having a coefficient of thermal expansion that is significantly different from that of the semiconductor material.

In still another embodiment of the present invention, a trench capacitor structure is disposed in a semiconductor substrate that includes an inner electrode formed as a filling of a trench that has been introduced into the semiconductor substrate from a process surface. The trench capacitor structure includes an outer electrode provided as a doped region of the semiconductor that surrounds the trench, and an insulator structure that insulates the inner electrode from the outer electrode. The trench is introduced into the semiconductor substrate in the manner described above for the process for introducing a trench structure into a semiconductor substrate.

The above and still further objects, features and advantages of the present invention will become apparent upon consideration of the following detailed description of specific embodiments thereof, particularly when taken in conjunction with the accompanying drawings wherein like reference numerals in the various figures are utilized to designate like components.

DETAILED DESCRIPTION

Figure 1A:
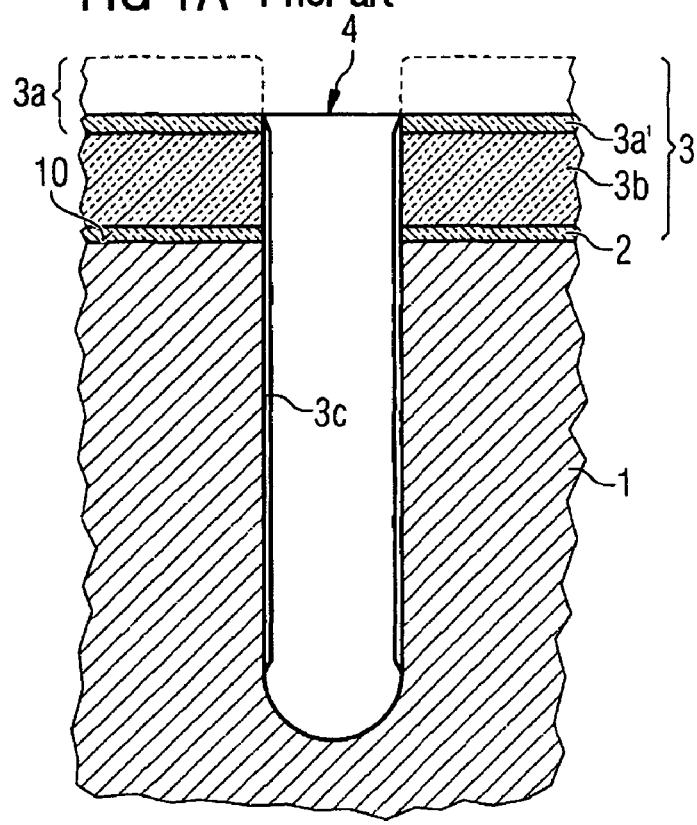
FIG. 1 diagrammatically depicts two process stages of a conventional trench etch.

In accordance with one aspect of the present invention, a covering layer is applied to a semiconductor substrate. For this purpose, a semiconductor substrate formed from a semiconductor material is provided. A stress relief layer is provided on a process surface of the semiconductor substrate. The covering layer, which is formed from a covering material, is applied to the stress relief layer. The covering material has an expansion coefficient which differs significantly from the expansion coefficient of the semiconductor material.

According to another aspect of the invention, the stress relief layer is produced by thermal nitriding of the semiconductor material of the semiconductor substrate beneath it. According to the invention, therefore, the silicon dioxide which is customarily present as a material for stress relief layers between a semiconductor substrate and a covering layer above it with significantly different coefficients of thermal expansion is replaced by a thermally grown silicon nitride. The thermally grown silicon nitride differs fundamentally, in terms of its thermomechanical properties, from, for example, a deposited silicon nitride layer and transforms a significant proportion of the thermally induced mechanical stresses into a compressive stress acting on the semiconductor substrate below. Stresses which run parallel to the process surface and can lead to dislocations in the covering layer above are transformed into a stress acting vertically with respect to the process surface.

The process according to the invention makes it possible to apply and join a very wide range of covering layers to a semiconductor substrate below.

The covering material provided is preferably silicon nitride, which is produced from a standard process for depositing silicon nitride, for example a high-temperature nitriding process or a plasma nitriding process. With regard to the etching processes which are customarily used in semiconductor process technology, the thermally produced silicon nitride behaves similarly to deposited silicon nitride. If the properties of both the material of the covering layer and the properties of the silicon dioxide stress relief layer are to be taken into account in a subsequent processing operation, for example after patterning of the covering layer and of the stress relief layer, according to the invention only the properties of silicon nitride then have a determining influence. There are no restrictions on subsequent process steps which have hitherto been caused by the use of silicon dioxide as stress buffer layer. In particular, it is possible to introduce etching processes which attack silicon dioxide or to carry out such processes over a longer process time.

For the nitriding operation, monocrystalline silicon of the semiconductor substrate is exposed to a nitrogen-containing reactant and heated. It is preferable for ammonia ($NH_3$) to be supplied as reactant for the nitriding.

While the thermal silicon nitride layer is being grown, the nitrogen contained in the process atmosphere passes through a portion of the silicon nitride layer which has already been formed to the process surface of the semiconductor substrate, where it reacts. The layer thickness of the silicon nitride layer which the ammonia is able to overcome is dependent on the process temperature. Consequently, the thermal growth of silicon nitride is self-limiting, and the layer thickness which can be achieved is dependent on the process temperature.

It is preferable for the stress relief layer to be formed in a temperature range between 750° C. and 1200° C., in particular between 900° and 1000° C. and particularly preferably in the region around 950° C., so that the grown silicon nitride layer is produced in a layer thickness of from 1.5 to 2.0 nanometers.

For the nitriding operation, the semiconductor substrate is moved into a process chamber and ammonia is fed to the process chamber.

The stress relief layer is particularly advantageously formed during a preanneal step. In a standard preanneal step, the semiconductor substrate is subjected to a heat treatment in an inert environment. The parameters of the heat treatment, such as the preanneal temperature and the preanneal duration, are selected in such a way that oxygen diffuses virtually completely or substantially out of a portion of the semiconductor substrate between a substrate surface and a preselected target depth.

The target depth is in this context predetermined by the bottom edge of the structures of electronic circuits which are to be formed in the semiconductor substrate, for example trench capacitors or insulator structures.

Trenches for storage capacitors for DRAMs with trench memory cells in 100 and sub-100 nanometer technology extend down to a depth of approximately 8 micrometers. The corresponding target depth is approximately 12 micrometers.

The semiconductor substrates are generally in the form of wafers with a diameter of 200 or 300 millimeters and a thickness of a few millimeters. Prior to commencement of processing used to form the electronic circuits in or on the semiconductor wafers, the semiconductor wafers are in some cases subjected to cleaning procedures.

The above-described preanneal step forms the end of the cleaning procedures and, at the same time, the start of the processing of the semiconductor wafer in the narrower sense. Over the course of the heat treatment, oxygen is virtually completely or substantially expelled from the semiconductor wafer down to a depth of several micrometers.

The preanneal step is usually carried out at a preanneal temperature of at least 800 to 1000 degrees Celsius. The duration of the heat treatment is several hours.

The oxygen which is expelled forms an aggressive environment, for example on account of the temporary formation of silicon monoxide, and this environment partially etches an unprotected substrate surface of the corresponding semiconductor wafer, which disadvantageously leads to the formation of etch pits at the unprotected substrate surface.

Therefore, it is customary for a temporary etching protection layer, for example a thermally produced silicon oxide, to be applied to the substrate surface prior to the preanneal step. If thermally grown silicon nitride is subsequently provided as stress relief layer, the temporary etching protection layer should be removed again following the preanneal step and prior to the growth of the thermal silicon nitride.

It has been possible to demonstrate that the growth of the thermal silicon nitride can be controlled together with the preanneal step as a combination process, in which case either the preanneal step can be regarded as a subprocess which directly follows the growth of the thermal silicon nitride or the growth of the thermal silicon nitride can be regarded as a first process phase of the preanneal step.

For this purpose, a semiconductor substrate which has not yet been heat treated is introduced into a process chamber. Ammonia is fed to the process chamber and in the process the semiconductor substrate is heated. In a first process phase, the thermal nitride grows on the substrate surface. At the same time and subsequently, oxygen is expelled from the semiconductor substrate and accumulates at the phase boundary with the thermal nitride, the oxygen being partially dissolved in the thermal nitride to form oxynitride.

The nitriding is self-limiting and the layer thickness which is reached is dependent on the preanneal temperature. After the thermal silicon nitride layer has reached the target layer thickness, therefore, it is advantageously possible to terminate the supply of ammonia, with the semiconductor substrate continuing to be held at least at the preanneal temperature, which is necessary in order for further oxygen to be expelled from the portion of the semiconductor substrate between the substrate surface and the target depth.

The preanneal time is selected as a function of the preanneal temperature and/or as a function of the time curve of the preanneal temperature, in such a way that the heat treatment causes virtually all the oxygen in the semiconductor substrate down to a target depth to diffuse out. If the supply of ammonia is terminated after the stress relief layer has been formed to the preselected target layer thickness, the further heat treatment is carried out in an inert atmosphere and/or with an inert purge gas being supplied.

For semiconductor substrates which are intended to form trench memory cells, the preanneal temperature is selected to be at least 1000 degrees Celsius and the preanneal duration is selected to be at least 2 hours.

In a first preferred embodiment, the substrate surface is cleaned prior to the nitriding, so that the thermal nitride grows on a blank substrate surface formed by single-crystal silicon.

In a second preferred embodiment, the silicon nitride is grown, for example, on a monomolecular, native silicon oxide coating of the single-crystal semiconductor substrate, as is formed on the semiconductor substrate under standard or ambient conditions. During the preanneal step, the native silicon oxide is virtually completely or substantially taken up in the thermal silicon nitride on account of the fact that it is partly converted into silicon nitride, releasing oxygen, and partly dissolved in the thermal silicon nitride to form oxynitride.

A further advantage of the process according to the invention results when the deposited silicon nitride layer and the thermally produced silicon nitride layer are being caused to recede in parts or completely. Since the same process chemistry has a similar action on both layers, both layers can be removed in a single step without the need to change the etching process and the etchant, with the etching process stopping at the semiconductor substrate below.

The process according to the invention for applying a covering layer leads to an advantageous new type of process for applying a mask for trench etching processes in semiconductor substrates. For a process of this type, a semiconductor substrate consisting of a semiconductor material is provided. A stress relief layer is provided on a process surface of the semiconductor substrate. A mask, which includes at least one protective layer portion formed from a material that is resistant to a subsequent trench etching process, is applied to the stress relief layer. The material of the protective layer portion has a coefficient of thermal expansion which differs significantly from that of the semiconductor material.

According to the invention, the protective layer portion of the mask is provided in accordance with the above-described process for applying a covering layer. It is preferable for silicon nitride to be used as a mask or as a sublayer of a mask, on account of its high etching selectivity with respect to silicon and silicon dioxide and on account of its good barrier properties. Furthermore, silicon nitride layers are used as oxidation masks. The process according to the invention is advantageous in particular in conjunction with trench etching processes in semiconductor substrates, since in this context a mask is used not only for the trench etching process itself but also as a mask for a range of further process steps acting only on the trench structures. If the properties of different components of the mask are combined, the advantageous result is an increased process variability or a wider process window compared to the prior art when processing trench structures.

Each process step which, during processing in the trench, also acts on that portion of the stress relief layer which is uncovered at the trench wall in the region of the trench, can advantageously be carried out without any restriction resulting from the use of silicon dioxide.

The advantageous result is a process according to the invention for introducing a trench structure into a semiconductor substrate, in which first of all the semiconductor substrate consisting of a monocrystalline semiconductor material is provided. A protective layer portion of a mask is provided on a process surface of the semiconductor substrate. A hardmask portion of the mask is applied to the protective layer portion of the mask. The mask is patterned by a photolithographic process, and the pattern of the mask is imaged into the semiconductor substrate. The trench structure is formed in the semiconductor substrate.

Then, according to the invention, the mask is applied in accordance with the above-described process for applying a mask for trench etching processes in semiconductor substrates. The hard-mask portion is advantageously removed by a wet etching process without the stress relief layer being caused to recede and without any undercut etching of the nitride layer above it.

Furthermore, it is advantageous for undoped silicate glass to be provided as material for the hard-mask portion. Where hitherto, for example, borosilicate glass was provided as the hard-mask portion of the mask, since the etching time allowed for removal of the hard-mask portion was restricted on account of the corresponding etch also causing the silicon dioxide stress relief layer to recede, the replacement of the silicon dioxide stress relief layer with the thermally produced silicon nitride layer according to the invention advantageously allows the use of undoped silicate glass (USG) as hard-mask portion. USG is more resistant to etching, with the result that, for the same thickness of the hard-mask portion, the process time for a trench etch used to form the trench structures in the semiconductor substrate can be lengthened, allowing deeper trenches to be formed. On the other hand, a significantly longer wet-etching time is required for removal, and this has hitherto led to deep undercutting in the silicon dioxide stress relief layer. The replacement of the silicon dioxide stress relief layer with a stress relief layer formed from thermally grown silicon nitride therefore allows USG to be used as hard-mask portion of a mask for trench etching processes. The process according to the invention allows the formation of an advantageous layer arrangement having a semiconductor substrate made from a monocrystalline semiconductor material and a covering layer arranged over portions of a process surface of the semiconductor substrate with a layer thickness of at least 50 nanometers. The covering layer consists of a covering material with a coefficient of thermal expansion which differs significantly from that of the semiconductor material. A stress relief layer which is suitable for preventing the covering layer from flaking off in the event of high thermal loading is provided between the semiconductor substrate and the covering layer above it.

The stress relief layer consists of a thermally produced semiconductor nitride and has a layer thickness of at most 2.5 nanometers.

During patterning of the layer arrangement according to the invention and in subsequent process steps with remaining portions of covering layer and stress relief layer on top, it is advantageously possible to use etching processes which act on silicon oxide, which is not the case with known layer arrangements comprising stress relief layers formed from a silicon oxide.

The semiconductor nitride is preferably produced by nitriding of the semiconductor material of the semiconductor substrate below, which is more preferably silicon.

If the covering layer is formed from deposited silicon nitride, in the layer arrangement according to the invention, unlike the known layer arrangements comprising stress relief layers formed from silicon oxide, it is advantageously possible for the covering layer and the stress relief layer to be patterned in a single etching step without changing the process chemistry, the etching process or the etchant.

In a mask arrangement according to the invention for the trench etching of trench structures, a protective layer portion, which is resistant to the trench etch, of a mask is provided over a process surface of a semiconductor substrate. A hard-mask portion which is at least partially consumed during the trench etch is applied to the protective layer portion. The protective layer portion is formed in the manner of a covering layer of a layer arrangement as described above.

It is preferable for the hard-mask portion to be formed from undoped silicate glass, which has a higher etching resistance than a borosilicate glass provided in the prior art and allows a trench etch to act more deeply into the semiconductor substrate.

In a trench capacitor structure according to the invention formed in a semiconductor substrate, an inner electrode is formed as a filling of a trench that has been introduced into the semiconductor substrate from a process surface. An outer electrode of the trench capacitor structure is formed as a doped region in a portion of the semiconductor substrate which surrounds the trench and is insulated from the inner electrode by an insulator structure.

In the region of an opening in the trench above the process surface of the semiconductor substrate or the substrate edge, the trench capacitor structure advantageously does not have any defective structures formed from a filling material, or at least the dimensions of such structures are significantly reduced over the cross section of the trench opening compared to the prior art; the filling material is applied during filling of the trench with a conductive material, for example in order to form the inner electrode.

Figure 2:
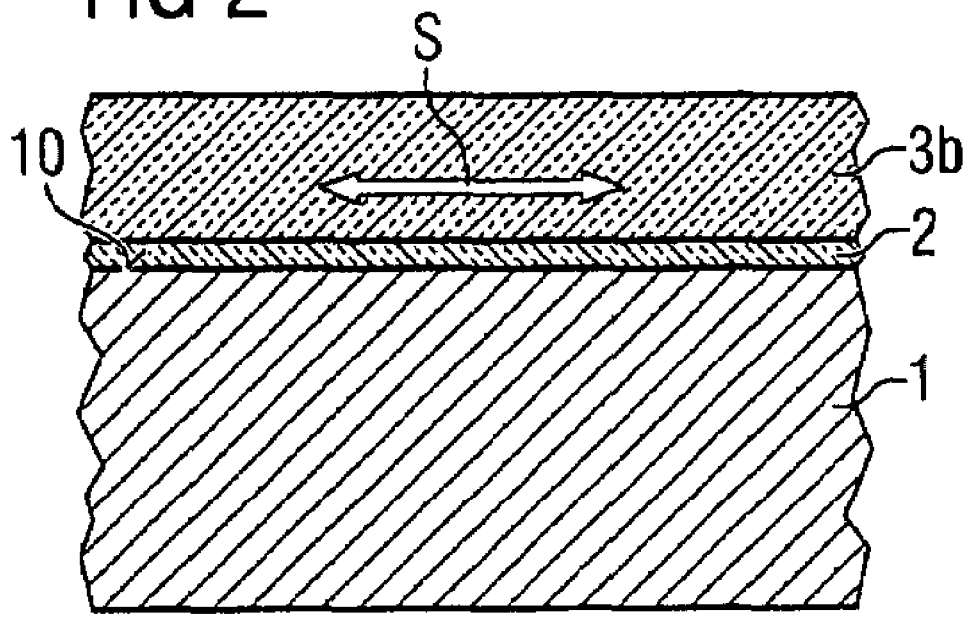
FIG. 2 depicts a covering layer above a semiconductor substrate in accordance with a first exemplary embodiment of the invention.

FIG. 2 depicts a layer arrangement according to the invention that has been produced using the process according to the invention and has a covering layer 3b formed from deposited silicon nitride and a semiconductor substrate 1. A stress relief layer 2 is provided between the covering layer 3b and the semiconductor substrate 1. When the arrangement is heated, the fact that the semiconductor substrate 1 and the covering layer 3b have different coefficients of thermal expansion leads to the formation of thermomechanical stresses S, which can lead to dislocations in the covering layer 3b and consequently to the covering layer 3b flaking off. The stress relief layer 2 transforms the thermomechanical stresses S acting parallel to the process surface 10 into a less disadvantageous or more favorable compressive pressure acting on the semiconductor substrate 1 below. The stress relief layer 2 consists of thermally deposited silicon nitride.

Figure 3:
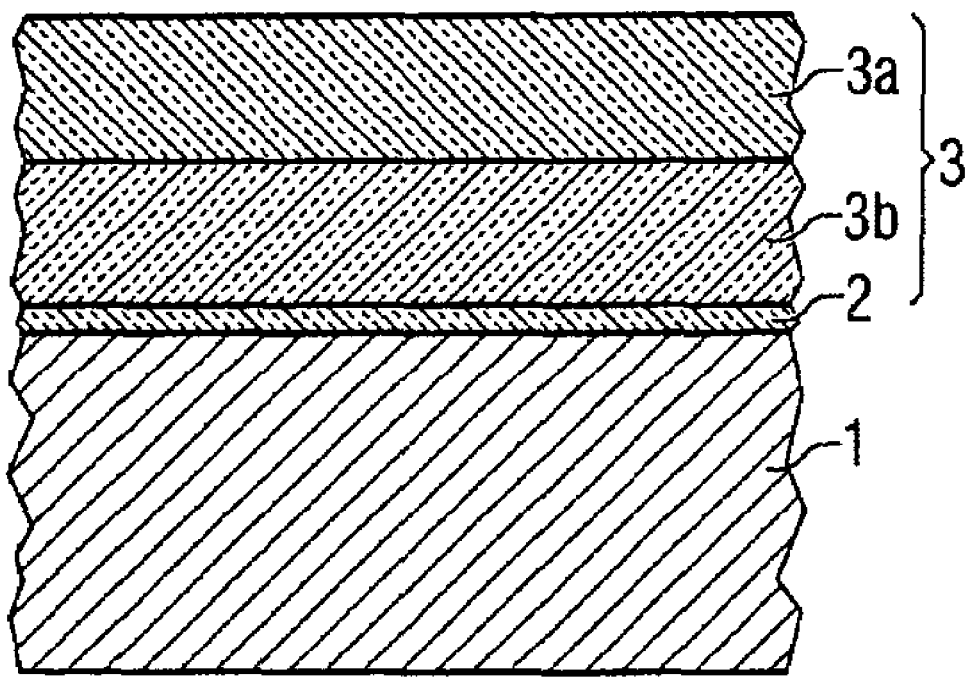
FIG. 3 depicts a mask above a semiconductor substrate in accordance with a second exemplary embodiment of the invention.

FIG. 3 depicts a mask arrangement according to the invention which is produced from the process according to the invention. The mask arrangement comprises a protective layer portion 3b formed from silicon nitride and a hard-mask portion 3a formed from a material containing silicon oxide. Since the stress relief layer 2 is provided from the same chemical compound as the protective layer portion 3b of the mask 3, after the mask 3 has been patterned, the hard-mask portion 3a can be processed or completely removed without any restrictions being imposed by the material of the stress relief layer 2.

Figure 1B:
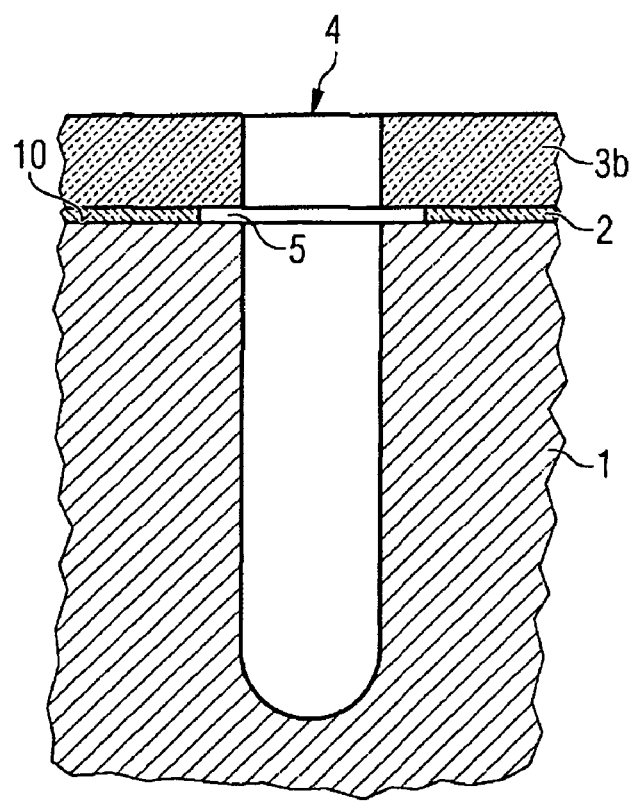
Figure 4:
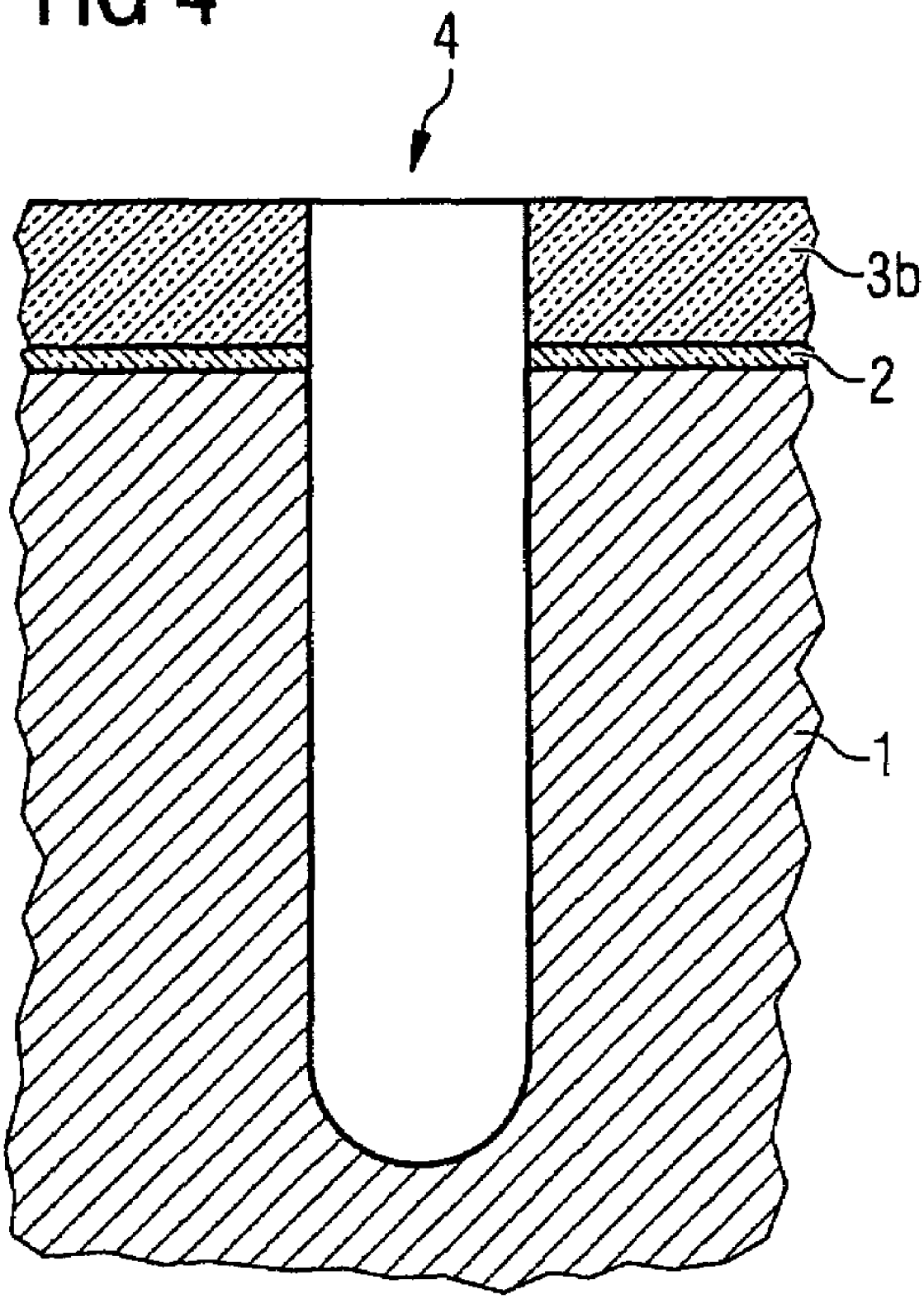
FIG. 4 depicts a result of a trench etch following a further exemplary embodiment of the invention.

FIG. 4 depicts a trench structure that has been introduced into a semiconductor substrate 1 using the process according to the invention in a process phase which is analogous to FIG. 1B. However, unlike in the case of the trench structure shown in FIG. 1B, the stress relief layer 2 has been produced from thermal nitridation of the semiconductor material of the semiconductor substrate 1.

Proceeding from FIG. 1A, the stress relief layer 2 shown in FIG. 4 is not attacked either during a cleaning etch process step for removal of the silicon oxide coating 3c or during an etchback process step acting on the hard-mask residues 3a'. No undercuts 5 are formed between the semiconductor substrate 1 and the protective layer portion 3b of the mask 3.

Figure 5A:
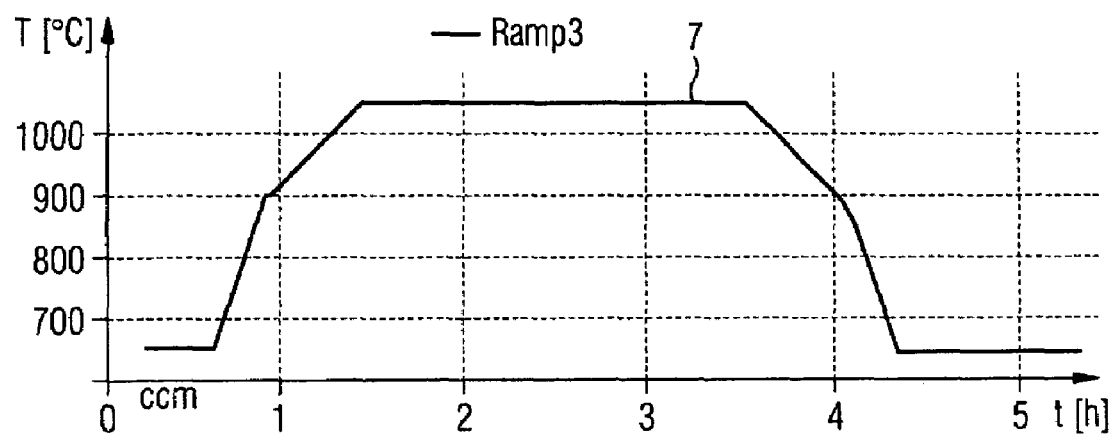
FIGS. 5A and 5B depict diagrams illustrating the profile of temperature and process gas flow for a further exemplary embodiment of the process according to the invention used to form a stress relief layer.
Figure 5B:
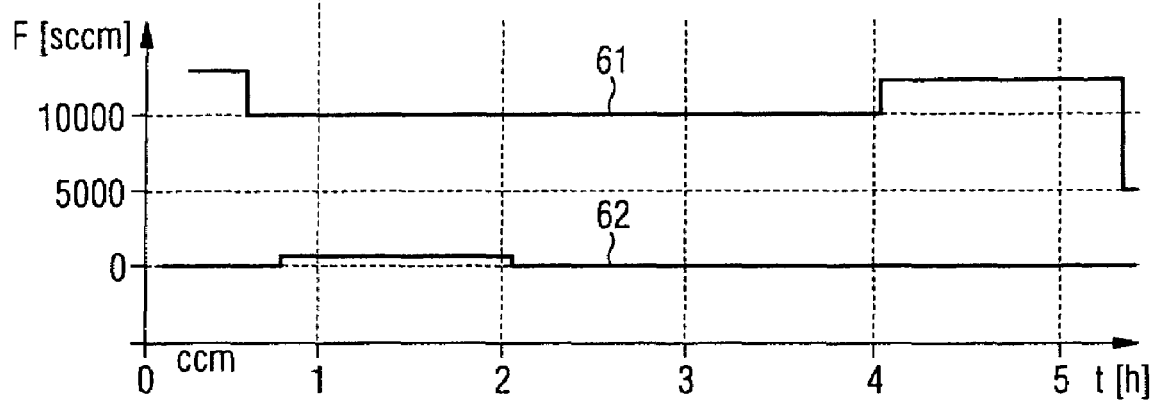

FIG. 5A depicts the curve (7) of a preanneal temperature to which a semiconductor substrate is exposed for a combination process for forming a stress relief layer and removing oxygen. FIG. 5B depicts the corresponding nitrogen flow (61) and ammonia flow (62). The time axes of the two diagrams are aligned with one another.

The abscissa indicates the process duration in hours, and the ordinate in FIG. 5A shows the temperature in degrees Celsius and in FIG. 5B shows the respective gas flow in standard cubic centimeters (sccm).

At the start of the combination process, the semiconductor substrate has been preheated to a temperature of 650 degrees Celsius. The process chamber is continuously purged with nitrogen as an inert purge gas. The temperature is increased at a rate of approximately 800 degrees per hour. Starting from a temperature of approximately 800 degrees Celsius, ammonia is fed to the process chamber at a flow rate of 1,000 sccm. After a temperature of approximately 900 Celsius has been reached, the temperature curve is initially shallowed out to a rate of increase of approximately 300 degrees per hour and then kept constant after a temperature of approximately 1050 degrees Celsius has been reached. The supply of ammonia is terminated after about 75 minutes. The temperature is held at 1050 degrees Celsius for slightly more than 2 hours and is then lowered in a mirror image of the heating phase.

Fewer than 100 etch pits attributable to the outdiffusion of oxygen are counted on a semiconductor wafer with a diameter of 300 millimeters which has been processed in this way.

While the invention has been described in detail and with reference to specific embodiments thereof, it will be apparent to one skilled in the art that various changes and modifications can be made therein without departing from the spirit and scope thereof. Accordingly, it is intended that the present invention covers the modifications and variations of this invention provided they come within the scope of the appended claims and their equivalents.

What is claimed is:

1. A method of forming an integrated semiconductor circuit, comprising:
   providing a semiconductor substrate that is formed from a monocrystalline semiconductor material;
   subjecting the semiconductor material to thermal nitridation so as to form a stress relief layer on a process surface of the semiconductor substrate, wherein the nitridation includes orienting the semiconductor substrate within a process chamber and subjecting the semiconductor substrate to a heat treatment to cause oxygen to substantially diffuse out of the semiconductor substrate at least down to a target depth defined by a lower edge of structures that are to be formed in the semiconductor substrate, and the nitridation is carried out at least during a portion of the heat treatment;

applying a protective layer portion of a mask to the stress relief layer, wherein the protective layer portion is made from a covering material with an expansion coefficient that is significantly different from that of the semiconductor material; and patterning the mask via photolithography and imaging the pattern of the mask to form a trench structure in the semiconductor substrate.

2. The method of claim 1, wherein the covering material comprises silicon nitride.

3. The method of claim 2, wherein the semiconductor material comprises monocrystalline silicon, and the stress relief layer is formed from thermally produced silicon nitride.

4. The method of claim 1, wherein the nitridation is carried out using ammonia as a reactant.

5. The method of claim 4, wherein the nitridation is carried out at a process temperature of at least 750 degrees Celsius.

6. The method of claim 1, wherein the nitridation is carried out on a substrate surface of the semiconductor substrate that is formed from monocrystalline silicon.

7. The method of claim 1, wherein the nitridation is carried out on a substrate surface of the semiconductor substrate that is coated with native silicon oxide grown under ambient conditions.

8. The method of claim 1, wherein the supply of ammonia is terminated after the stress relief layer has been formed in a target layer thickness.

9. The method of claim 1, wherein the stress relief layer is provided before a first lithographic structuring of the semiconductor substrate.

10. A layer arrangement comprising:
a semiconductor substrate comprising a monocrystalline semiconductor material;
a covering layer arranged in portions over a process surface of the semiconductor substrate, the covering layer having a layer thickness of at least 50 nanometers and comprising a covering material with a coefficient of thermal expansion that is significantly different from that of the semiconductor material, and
a stress relief layer provided between the semiconductor substrate and the covering layer, the stress relief layer being suitable for preventing the covering layer from flaking off in the event of high thermal loading, consisting of a thermally produced semiconductor nitride and having a layer thickness of no greater than 2.5 nanometers.

11. The layer arrangement as claimed in claim 10, wherein the semiconductor nitride is produced from nitridation of the semiconductor material.

12. The layer arrangement of claim 10, wherein the semiconductor material is silicon.

13. The layer arrangement of claim 10, wherein the covering layer comprises deposited silicon nitride.

14. The layer arrangement of claim 10, wherein the covering layer comprises a protective layer portion of a mask arrangement to facilitate trench etching of trench structures into the semiconductor substrate, the protective layer portion being provided over the process surface of the semiconductor substrate and resistant to a trench etch, and a hard-mask portion of the mask arrangement that is provided on the protective layer portion so as to be at least partially consumed during the trench etch.

15. The layer arrangement of claim 14, wherein the hard-mask portion is formed from undoped silicate glass.

16. A method of forming an integrated semiconductor circuit, the method comprising:
providing a semiconductor substrate that is formed from a monocrystalline semiconductor material;
subjecting the semiconductor material to thermal nitridation so as to form a stress relief layer on a process surface of the semiconductor substrate;
applying a protective layer portion of a mask to the stress relief layer, wherein the protective layer portion is made from a covering material with an expansion coefficient that is significantly different from that of the semiconductor material;
applying a hard-mask portion of the mask to the protective layer portion; and
patterning the mask via a photolithographic method, the pattern of the mask being imaged into the semiconductor substrate so as to form a trench structure in the semiconductor substrate,
wherein the hard-mask portion is recessed by a wet etching process and an undercut is prevented from forming within the stress relief layer.

17. The method of claim 16, wherein the hard-mask portion comprises undoped silicate glass.

18. The method of claim 16, wherein, during the removal of hard-mask residuals after forming the trench, protective layer portion residuals and stress relief layer residuals are forced to recede in a single part etching process using the semiconductor substrate as an etching stop layer or etching stop signal layer.

19. A method of applying a covering layer to a semiconductor substrate, comprising:
providing a semiconductor substrate that is formed from a monocrystalline semiconductor material;
subjecting the semiconductor material to thermal nitridation so as to form a stress relief layer on a process surface of the semiconductor substrate, wherein the nitridation includes orienting the semiconductor substrate within a process chamber and subjecting the semiconductor substrate to a heat treatment to cause oxygen to substantially diffuse out of the semiconductor substrate at least down to a target depth defined by a lower edge of structures that are to be formed in the semiconductor substrate, and the nitridation is carried out at least during a portion of the heat treatment;
applying a covering layer to the stress relief layer, wherein the covering layer is made from a covering material with an expansion coefficient that is significantly different from that of the semiconductor material; and
forming a trench in the semiconductor substrate.

20. A method of forming a layer arrangement, the method comprising:
providing a semiconductor substrate comprising a monocrystalline semiconductor material;

arranging a covering layer in portions over a process surface of the semiconductor substrate, the covering layer having a layer thickness of at least 50 nanometers and comprising a covering material with a coefficient of thermal expansion that is significantly different from that of the semiconductor material; and providing a stress relief layer between the semiconductor substrate and the covering layer, the stress relief layer being suitable for preventing the covering layer from flaking off in the event of high thermal loading, consisting of a thermally produced semiconductor nitride and having a layer thickness of no greater than 2.5 nanometers.

* * * * *

UNITED STATES PATENT AND TRADEMARK OFFICE
CERTIFICATE OF CORRECTION

PATENT NO. : 7,547,646 B2 Page 1 of 1
APPLICATION NO. : 10/974797
DATED : June 16, 2009
INVENTOR(S) : Henry Bernhardt et al.

It is certified that error appears in the above-identified patent and that said Letters Patent is hereby corrected as shown below:

On the title page, under item (30) Foreign Application Priority Data, replace "Aug. 31, 2003" with -- Oct. 31, 2003 --.

Signed and Sealed this

Sixth Day of October, 2009

David J. Kappos
*Director of the United States Patent and Trademark Office*